United States Patent [19]

Bencuya et al.

[11] Patent Number: 4,692,780

[45] Date of Patent: Sep. 8, 1987

[54] JUNCTION FIELD EFFECT TRANSISTOR AND METHOD OF FABRICATING

[75] Inventors: Izak Bencuya; Adrian I. Cogan, both of San Jose, Calif.

[73] Assignee: GTE Laboratories Incorporated, Waltham, Mass.

[21] Appl. No.: 861,681

[22] Filed: May 12, 1986

Related U.S. Application Data

[62] Division of Ser. No. 729,025, Apr. 30, 1985, Pat. No. 4,611,384.

[51] Int. Cl.[4] .............................................. H01L 29/80
[52] U.S. Cl. ....................................... 357/22; 357/20; 357/55
[58] Field of Search ............................ 357/22, 55, 20

[56] References Cited

U.S. PATENT DOCUMENTS 4,404,575 9/1983 Shizawa ............................ 357/22 E Primary Examiner—Joseph E. Clawson, Jr.

Attorney, Agent, or Firm—David M. Keay

[57] ABSTRACT

Junction field effect transistor, specifically a static induction transistor, and method of fabricating. An epitaxial layer of high resistivity N-type silicon is grown on a substrate of low resistivity silicon. The surface of the epitaxial layer is coated with silicon nitride, portions of the silicon nitride are removed, and the silicon is etched to form parallel grooves with interposed ridges of silicon. A layer of silicon nitride is applied and then removed except from the side walls of the grooves. Exposed silicon at the bottoms of the grooves is converted to silicon dioxide to build up layers of silicon dioxide in the grooves. The remaining silicon nitride is removed. P-type conductivity imparting material is ion implanted into alternate (gate) ridges and diffused to form gate regions which extend laterally beneath the silicon dioxide in the adjacent grooves. N-type conductivity imparting material is ion implanted in the top of the intervening (source) ridges. Metal contacts are applied to the gate ridges, the source ridges, and the substrate.

5 Claims, 8 Drawing Figures

JUNCTION FIELD EFFECT TRANSISTOR AND METHOD OF FABRICATING

This a divisional of co-pending application Ser. No. 729,025 filed on Apr. 30, 1985, now U.S. Pat. No. 4,611,384.

BACKGROUND OF THE INVENTION

This invention relates to semiconductor devices. More particularly, it is concerned with junction field effect transistors of the static induction type and to methods of fabricating.

The static induction transistor is a field effect semiconductor device capable of operation at relatively high frequency and power. The transistors are characterized by a short, high resistivity semiconductor channel region which may be controllably depleted of carriers. The current-voltage characteristics of the static induction transistor are generally similar to those of a vacuum tube triode. These devices are described by Nishizawa et al in U.S. Pat. No. 3,828,230 issued Aug. 6, 1974, and in U.S. Pat. No. 4,199,771, issued Apr. 22, 1980. See also an article entitled "High Performance Microwave Static Induction Transistors" by Cogan et al, published in the proceedings of the International Electron Devices Meeting (IEEE), Dec. 5, 6, and 7, 1983, Washington, D.C., paper 9.5, page 221.

The static induction transistor generally uses vertical geometry with source and drain electrodes placed on opposite sides of a thin, high resistivity layer of one conductivity type. Gate regions of opposite conductivity type are positioned in the high resistivity layer on opposite sides of the source. During operation a reverse bias is applied between the gate region and the remainder of the high resistivity layer causing a depletion region to extend into the channel region below the source. As the magnitude of the reverse is varied, the source-drain current and voltage derived from an attached energy source will also vary.

One factor which limits the operation of static induction transistors at high frequency is gate capacitance. In order to obtain high voltage gain the gate junction must be located in the immediate vicinity of the source. A very short gate-to-source distance, however, causes the gate capacitance to be high. In addition, a short gate-to-source distance requires extremely tight tolerances and process control during device fabrication.

SUMMARY OF THE INVENTION

The method of fabricating a junction field effect transistor in accordance with the present invention provides an improved method of obtaining a high gain, low gate capacitance static induction transistor without requiring tight tolerances during fabrication.

The method in accordance with the present invention comprises providing a body of semiconductor material which includes a first layer of semiconductor material of one conductivity type of relatively high resistivity and a second layer of semiconductor material of the one conductivity type of relatively low resistivity contiguous with the first layer. The first layer has a surface at a surface of the body. An adherent layer of a first protective material is formed on the surface, and a plurality of parallel grooves are formed through the layer of protective material and into the first layer of semiconductor material to produce interposed ridges of semiconductor material. Each of the grooves has side walls formed by the adjacent ridges of semiconductor material and has a bottom. Alternate ridges are gate ridges and the intervening ridges between the gate ridges are source ridges. Adherent layers of the first protective material are formed on the side walls of the grooves, and the body is treated to form a layer of a second protective material, which is nonconductive, at the bottom of each of the grooves. The first protective material is then removed from the body. Conductivity type imparting material of the opposite conductivity type is introduced into the gate ridges of semiconductor material at the surface to convert zones of the first layer of semiconductor material to the opposite conductivity type, thereby forming gate regions of the opposite conductivity type. Each of the gate regions includes the associated gate ridge and has portions extending laterally beneath the bottom of the adjacent grooves toward the laterally extending portions associated with adjacent gate ridges to produce channel regions of the one conductivity type of relatively high resistivity between portions associated with adjacent gate ridges. Conductivity type imparting material of the one conductivity type is introduced into the source ridges of semiconductor material at the surface to produce a source region of the one conductivity type of relatively low resistivity in a zone adjacent to the surface in each of the source ridges. Conductive material is then applied to form electrical contacts in ohmic contact with the source and gate regions at the surface of the source and gate ridges, respectively.

A junction field effect transistor in accordance with the present invention comprises a body of semiconductor material including a first layer of semiconductor material and a second layer of semiconductor material which is of the one conductivity type of relatively low resistivity and is contiguous with the first layer. The first layer has a surface at a surface of the body. The first layer has a plurality of parallel grooves therein which extend from the surface with ridges of semiconductor material interposed between the grooves. Each of the grooves has side walls formed by the adjacent ridges of semiconductor material and has a bottom. Alternate ridges are gate ridges and intervening ridges between the gate ridges are source ridges. Each of the grooves contains layer of a protective material, which is nonconductive, at the bottom of the groove. Each of the source ridges has a source region of the one conductivity type of relatively low resistivity at the surface. A plurality of gate regions of the opposite conductivity type are located in the first layer and spaced from the second layer. Each of the gate regions encompasses a gate ridge and has portions extending laterally beneath the bottoms of the adjacent grooves. The first layer of semiconductor material other than the source regions and the gate regions is of the one conductivity type of relatively high resistivity. The portions of adjacent gate regions which extend laterally toward each other produce channel regions of the one conductivity type of relatively high resistivity therebetween.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with above-described drawings.

DETAILED DESCRIPTION OF THE INVENTION

In fabricating junction field effect transistors of the static induction type in accordance with the invention as illustrated in the figures a substrate of single crystal semiconductor material of one conductivity type is provided as a supporting structure. As is well understood the substrate is usually a slice or wafer of relatively large surface area upon which many identical devices are fabricated simultaneously. However, for purposes of illustration the fabrication of only a portion of a single static induction transistor in a fragment of a slice will be shown and described. In the following description silicon is employed as the semiconductor material and the substrate is of relatively low resistivity N-type conductivity.

Figure 1:
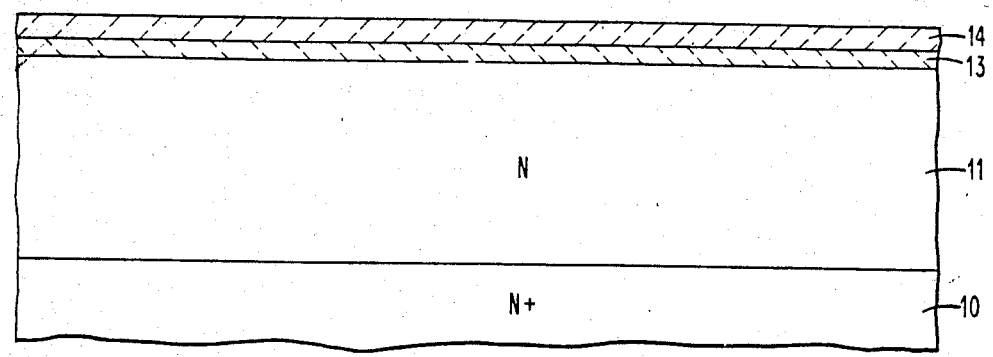
FIGS. 1–8 are a series of elevational views in cross-section of a fragment of a wafer of semiconductor material illustrating successive steps in the fabrication of a junction field effect transistor of the static induction type in accordance with the present invention.

A slice or wafer of N-type silicon of uniform, relatively low resistivity having flat, planar, parallel, opposed major surfaces, a fragment 10 of which is shown in FIG. 1, is produced by any of the known techniques of crystal fabrication including appropriate slicing and cleaning operations. An epitaxial layer 11 of N-type silicon of uniform relatively high resistivity is grown on the surface of the substrate as by known vapor deposition techniques. A layer 11 which is precisely controlled as to thickness and as to resistivity and which is a continuation of the crystalline structure of a single crystal substrate 10 is thus deposited on the surface of the substrate. The upper surface of the epitaxial layer 11 is parallel to the interface between the substrate and the layer. Next, the surface of the wafer is covered with an adherent protective layer of silicon nitride 14. As is well known in the art, a thin buffer layer 13 of silicon dioxide is first formed on the surface of the wafer to reduce thermal mismatch effects.

Figure 2:
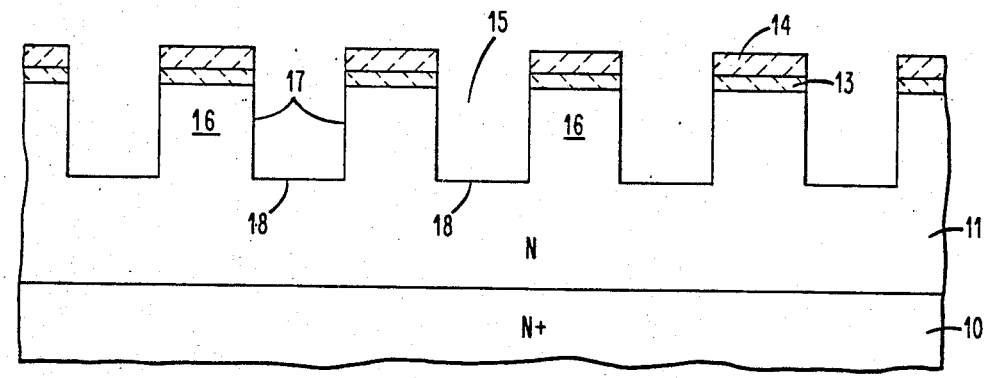

By employing standard photoresist masking and etching techniques portions of the silicon nitride layer 14 and the silicon dioxide layer 13 are removed to expose the silicon surface in a pattern of parallel areas. As illustrated in FIG. 2 exposed silicon is removed by employing known anisotropic etching techniques, such as reactive ion etching, to form a plurality of parallel grooves or trenches 15 leaving interposed between the grooves 15 finger-like ridges 16 of silicon. Each of the grooves 15 has opposite side walls 17 formed by the two adjacent ridges 16 and also an end wall or bottom 18.

Figure 3:
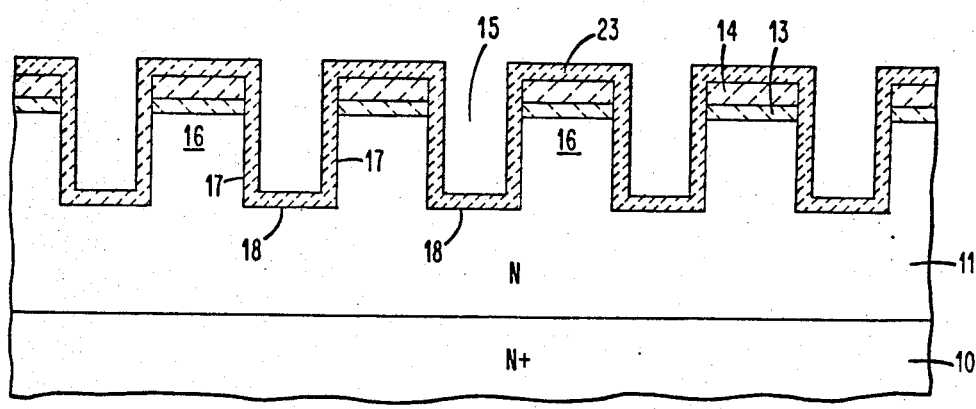
Figure 4:
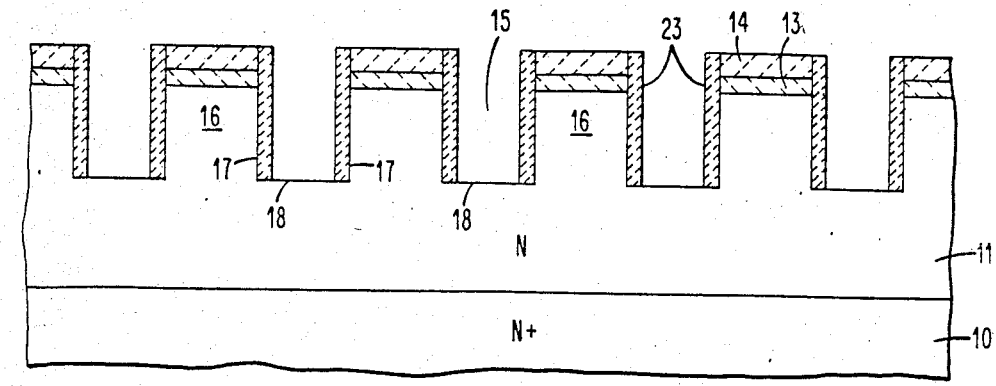

As illustrated in FIG. 3 a continuous layer of silicon nitride 23 is deposited over the exposed surfaces of the wafer, coating the side walls 17 and bottom 18 of each of the grooves 15 and overlying the first silicon nitride layer 14 on the ridges 16. The wafer is then subjected to etching in conventional reactive ion etching apparatus. As is well understood, the reactive ion etching procedure can be adjusted to remove all materials at a substantially equal rate in the vertical direction but has little effect in removing materials laterally. The process is carried out for sufficient time to remove the silicon nitride of the second layer 23 until the silicon at the bottom 18 of the grooves is exposed. At the same time, the second layer of silicon nitride is removed from the upper surfaces of the ridges 16. The adherent silicon nitride layers 23 at the side walls 17 of the grooves 15 remain essentially intact. FIG. 4 illustrates the wafer at this stage of the process.

Figure 5:
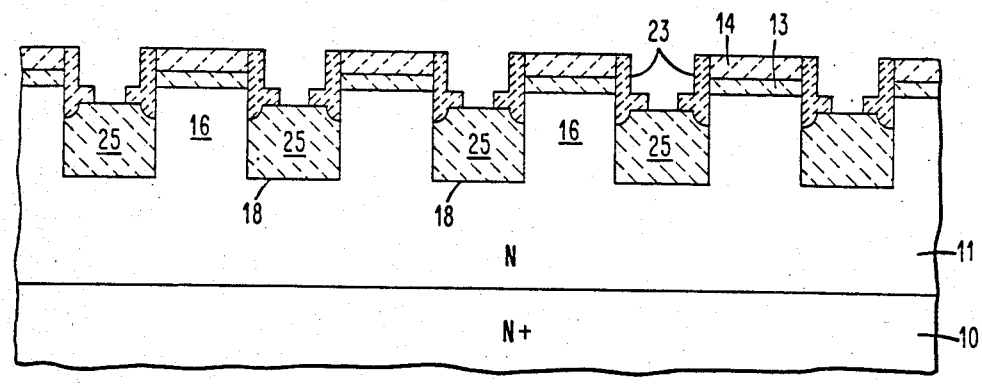

The wafer is then exposed to oxygen at an elevated temperature to grow silicon dioxide at all the exposed silicon surfaces not protected by silicon nitride. As illustrated in FIG. 5 since only the silicon at the bottom 18 of the groove 15 is exposed, layers of silicon dioxide 25 grow in the lower portions of the grooves by converting the silicon to silicon dioxide. After the formation of the silicon dioxide layers 25 in the grooves 15, all of the remaining silicon nitride 14 and 23 and the underlying silicon dioxide buffer layer 13 are removed.

Figure 6:
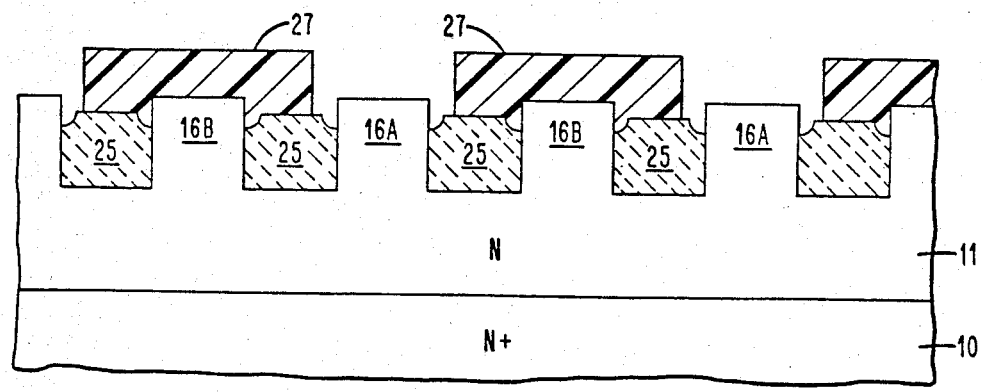

Employing known techniques, a layer of photoresist material 27 is applied to the surface of the wafer and then selectively removed to expose alternate ridges 16A while leaving protected the intervening ridges 16B as illustrated in FIG. 6. P-type conductivity imparting material is then introduced into the silicon at the exposed surfaces of the alternate ridges 16A by conventional ion implantation techniques. The photoresist layer 27 protects the remaining surface areas of the wafer. After ion implantation, the photoresist layer 27 is removed and the wafer is heated to cause the implanted conductivity type imparting material to diffuse throughout the alternate ridges 16A and laterally as well as vertically from the bases of the ridges 16A. As illustrated FIG. 7, zones of P-type conductivity 30 are thus produced inset in the high resistivity N-type material of the epitaxial layer 11. The laterally extending portions 30a of the P-type zones 30 extend beneath the adjacent silicon dioxide layers 25 in the grooves 16 toward the laterally extending portions 30a of the P-type zones 30 from the adjacent alternate ridges 16A.

Figure 7:
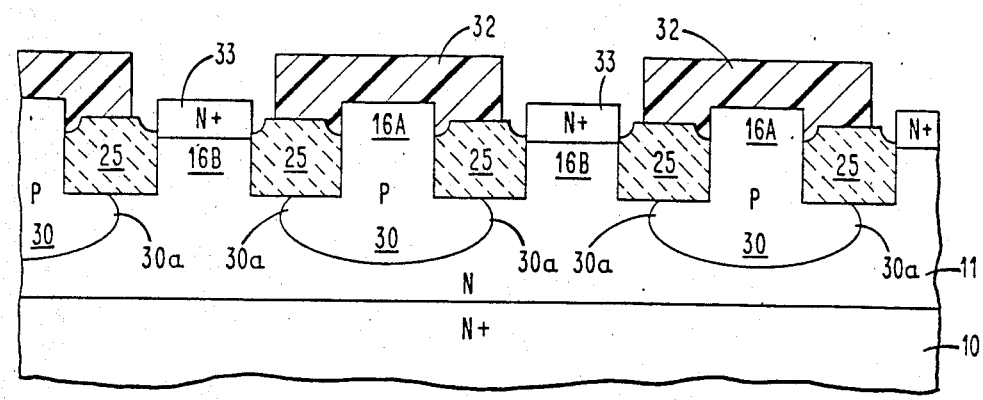

As illustrated in FIG. 7 a layer of photoresist material 32 is then placed on the surface of the wafer and selectively removed to expose the surfaces of the intervening ridges 16B. The wafer is subjected to treatment in conventional ion implantation apparatus to implant N-type conductivity material in the zones 33 at the upper surface of the intervening ridges 16B. The photoresist layer 32 is then removed, and the wafer is annealed in order to activate the implanted ions.

A layer of metal, specifically aluminum, is applied to the entire surface of the wafer. The metal layer is appropriately masked and etched to provide gate and source contact members 34 and 35 in ohmic contact with the surface areas of the alternate and intervening ridges 16A and 16B, respectively. The gate contacts 34 are appropriately connected together and to a gate bonding pad (not shown), and the source contacts 35 are appropriately connected together and to a source bonding pad (not shown) in a conventional manner. A metal layer 37 is applied to the bottom surface of the substrate 10 in order to provide a suitable drain contact member as illustrated in FIG. 8.

Figure 8:
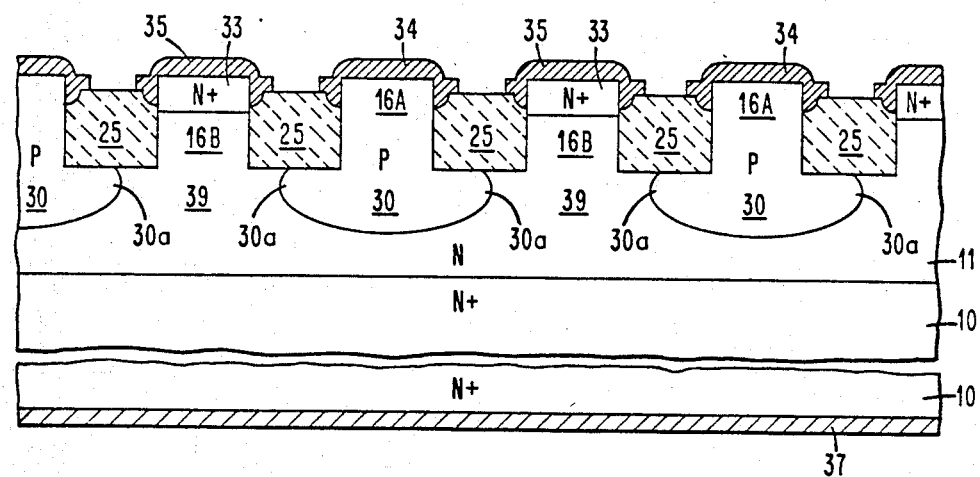

The resulting junction field effect transistor (JFET) as illustrated in FIG. 8 includes source regions 33 of low resistivity N-type silicon in the intervening ridges 16B and a drain region of low resistivity N-type silicon provided by the substrate 10. Channel regions 39 of high resistivity N-type silicon between each source region 33 and the drain region 10 lie between the laterally extending portions 30a of the P-type gate regions 30.

In the fabrication of an exemplary static induction transistor structure in accordance with the present invention, the substrate 10 may be a slice of single crystal N-type silicon doped with antimony to provide a uniform resistivity of 0.01 to 0.05 ohm centimeters. The N-type epitaxial layer 11 of relatively high resistivity silicon is doped with arsenic during deposition to provide a uniform resistivity of about 15 ohm-centimeters. The epitaxial layer 11 may be about 10 micrometers thick. The grooves 15 are about 0.5 to 1 micrometer deep and may be approximately 2 micrometers wide. The interposed ridges 16 may have a width of approximately 2 micrometers. The P-type gate regions 30 are formed by ion implanting and then diffusing boron into the wafer. Arsenic is implanted to form the N-type source regions 33.

As illustrated by the portion of the final device illustrated in FIG. 8, the static induction transistor as fabricated in accordance with the foregoing method has a relatively large gate-to-source distance by virtue of the vertical displacement of the gate-channel junctions from the surface by the intervening silicon dioxide layers in the grooves. This spacing is obtained while providing a relatively narrow channel between the laterally extending portions of the gate regions; the width of the channel regions being determined relatively free of the gate-to-source spacing. In addition, positioning the gate-channel junctions below the surface of the wafer contributes to improved breakdown voltage characteristics. The process in accordance with the invention as described employees individually well-known techniques. The elements of the device are defined by self-alignment with existing structure or have relatively loose tolerances thus alleviating the necessity for precise alignment and registration of masks between processing steps. Thus a high gain, low gate capacitance static induction transistor is provided without requiring tight tolerances during fabrication.

While there has been shown and described what is considered a preferred embodiment of the present invention, it will be obvious to those skilled in the art that various changes and modifications may be made therein without departing from the invention as defined by the appended claims.

What is claimed is:

1. A junction field effect transistor comprising
    a body semiconductor material including a first layer of semiconductor material and a second layer of semiconductor material of one conductivity type of relatively low resistivity contiguous with said first layer, said first layer having a surface at a surface of the body;
    said first layer having a plurality of parallel grooves therein extending from said surface thereof with ridges of semiconductor material interposed between the grooves, each of said grooves having side walls formed by the adjacent ridges of semiconductor material and having a bottom, the width of each of said grooves being approximately the same as the width of each of said ridges, alternate ridges being gate ridges and intervening ridges between the gate ridges being source ridges;
    each of said grooves containing a layer of protective material which is nonconductive at the bottom thereof;
    a source region of the one conductivity type of relatively low resistivity in each of said sources ridges at said surface;
    a plurality of gate regions of the opposite conductivity type in said first layer and spaced from said second layer, each of said gate regions encompassing a gate ridge and having portions extending laterally beneath the bottoms of the adjacent grooves; and
    said first layer of semiconductor material other than said source regions and said gate regions being of the one conductivity type of relatively high resistivity, the portions of adjacent gate regions extending laterally toward each other producing channel regions of the one conductivity of relatively high resistivity therebetween.

2. A junction field effect transistor in accordance with claim 1 wherein
    said semiconductor material is silicon; and
    said protective material is silicon dioxide.

3. A junction field effect transistor in accordance with claim 2 including
    a gate contact member in ohmic contact with the semiconductor material of the opposite conductivity type at each of said gate ridges at said surface;
    a source contact member in ohmic contact with the semiconductor material of the one conductivity type of each of said source ridges at said surface; and
    a drain contact member in ohmic contact with the semiconductor material of the one conductivity type of relatively low resistivity of said second layer.

4. A junction field effect transistor in accordance with claim 3 wherein
    each of said grooves is from about 0.5 to 1 micrometer deep and approximately 2 micrometers wide; and
    each of said ridges is approximately 2 micrometers wide.

5. A junction field effect transistor in accordance with claim 4 wherein
    said one conductivity type is N-type; and
    said opposite conductivity type is P-type.

* * * * *